United States Patent [19]
Butts et al.

[11] Patent Number: 5,345,807
[45] Date of Patent: Sep. 13, 1994

[54] SELF-CALIBRATING VARIABLE PRESSURE TOUCH KEY SYSTEM EMPLOYING TRANSDUCERS SUBJECT TO PARAMETER DRIFT

[75] Inventors: Orville R. Butts, Chattanooga, Tenn.; Paul R. Tanner, Ft. Oglethorpe, Ga.

[73] Assignee: General Electric Company, Louisville, Ky.

[21] Appl. No.: 73,633

[22] Filed: Jun. 8, 1993

Related U.S. Application Data

[63] Continuation of Ser. No. 769,370, Oct. 1, 1991, abandoned.

[51] Int. Cl.⁵ .............................................. G01L 27/00
[52] U.S. Cl. ...................................... 73/4 R; 73/1 B
[58] Field of Search .................. 73/1 B, 4 R, 865.7, 73/862.68; 324/679, 684; 361/283, 272; 364/571.01

[56] References Cited

U.S. PATENT DOCUMENTS

| | | | |
|---|---|---|---|
| 2,614,416 | 10/1952 | Hollmann | 73/862.68 |
| 4,103,252 | 7/1978 | Bobick | 331/48 |
| 4,219,089 | 8/1980 | Gard et al. | 177/165 |
| 4,313,510 | 2/1982 | Tomlinson, Jr. | 364/567 |
| 4,673,919 | 6/1987 | Kataoka | 340/365 |
| 4,694,279 | 9/1987 | Meno | 326/679 |
| 4,909,063 | 3/1990 | Olsen | 73/4 R |
| 4,926,674 | 5/1990 | Fossum et al. | 73/4 R |

FOREIGN PATENT DOCUMENTS

| | | |
|---|---|---|
| 0178768 | 4/1986 | European Pat. Off. |
| 3839655 | 4/1989 | Fed. Rep. of Germany |
| 2512318 | 8/1982 | France |
| 61-234121 | 10/1986 | Japan |
| 62-233822 | 10/1987 | Japan |

*Primary Examiner*—Robert Raevis
*Attorney, Agent, or Firm*—H. Neil Houser

[57] ABSTRACT

A pressure sensitive touch pad system, for example employing variable capacitance touch pads, employs low cost transducers subject to parameter drift and periodically (e.g. once each second) re-calibrates each touch pad. The periodic re-calibration allows a low cost transducer to be used for multi-point operation, as well as for simple on/off operation, such as for function selection. One application is to provide different slew rates for setting a data entry indicator, for example indicating the value of an appliance function.

23 Claims, 5 Drawing Sheets

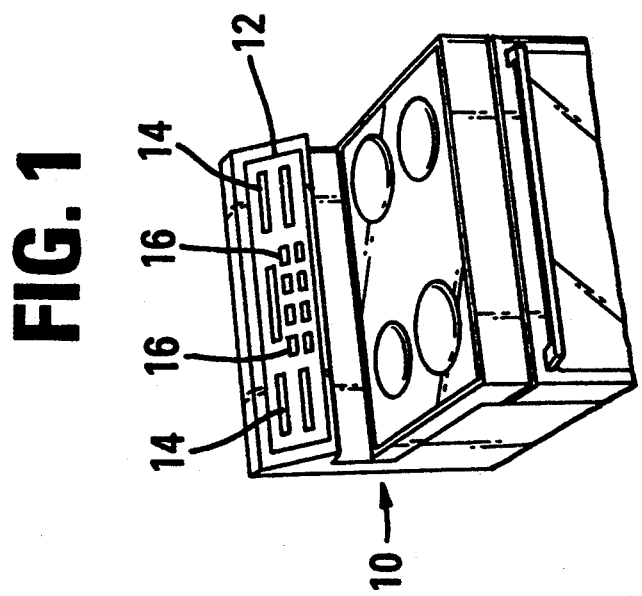
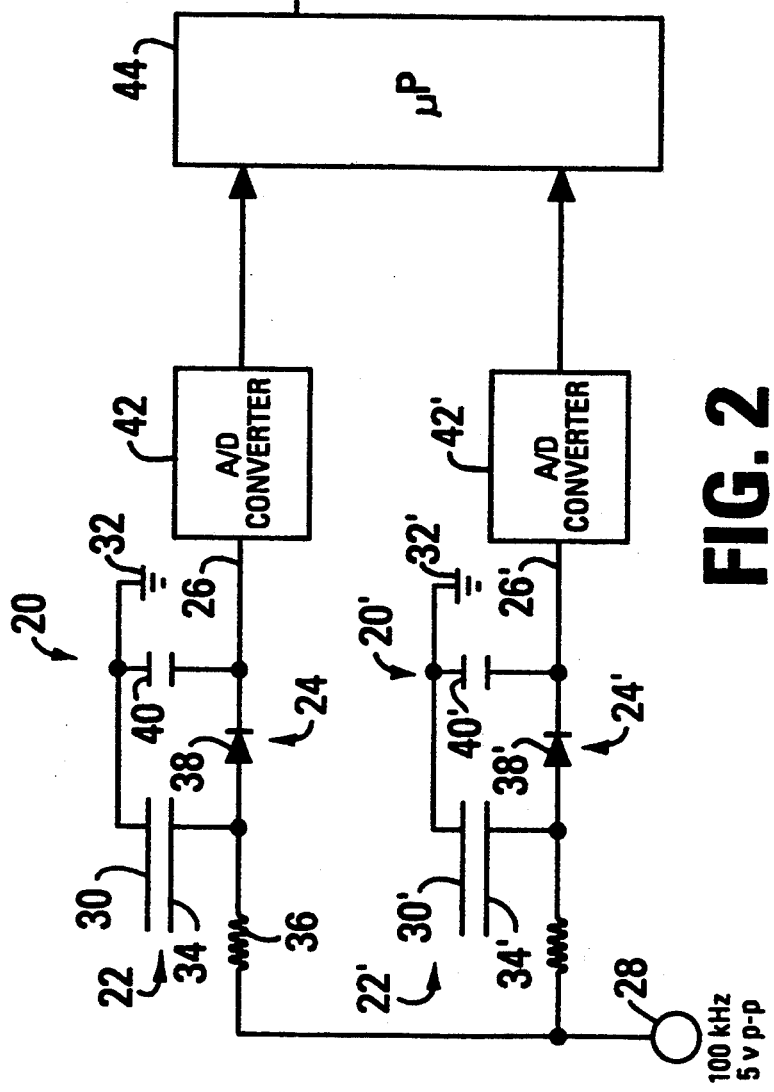

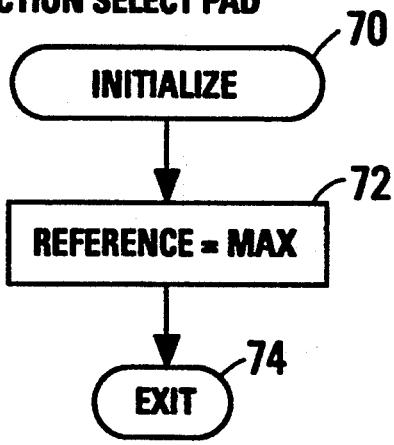
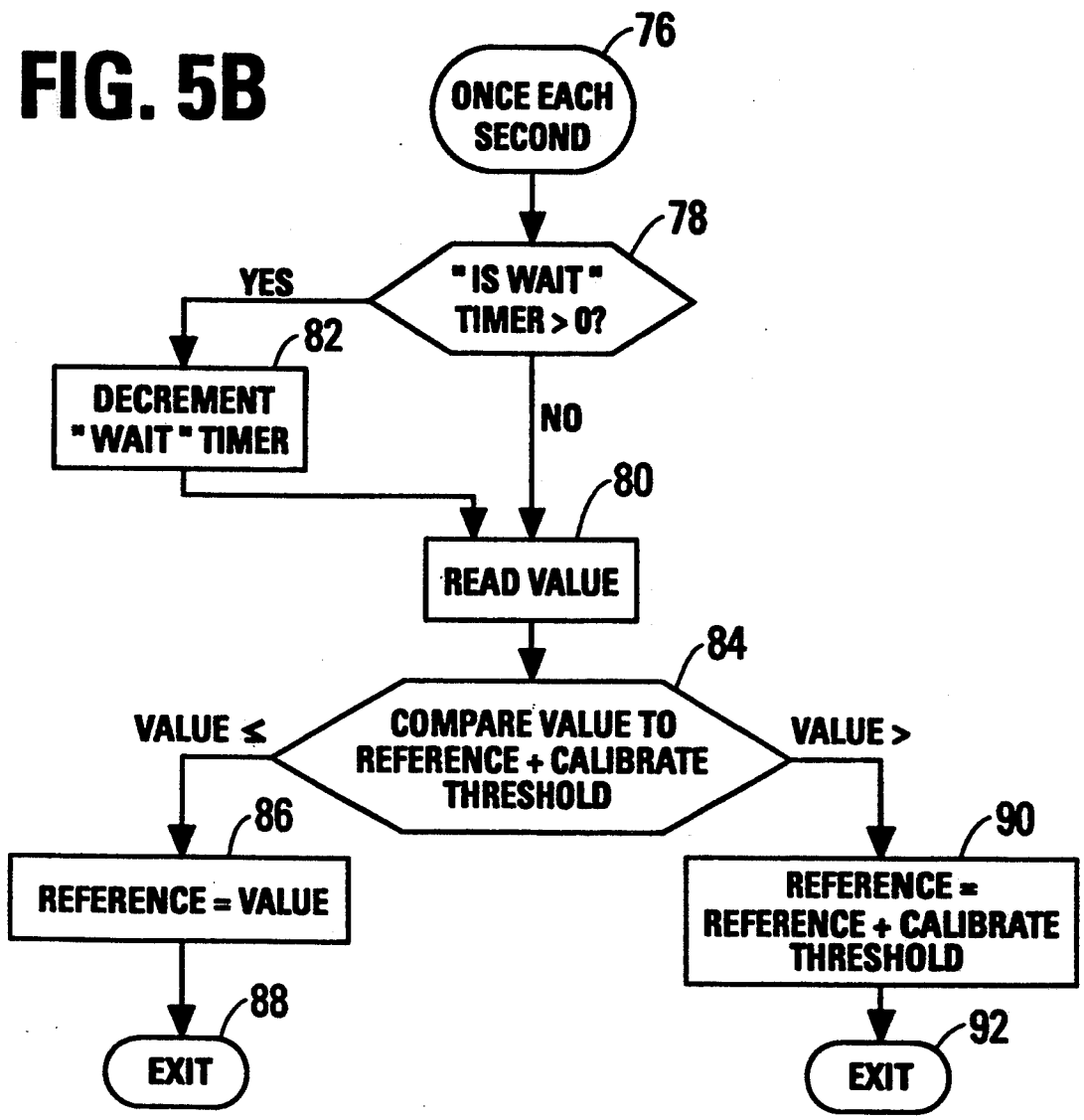

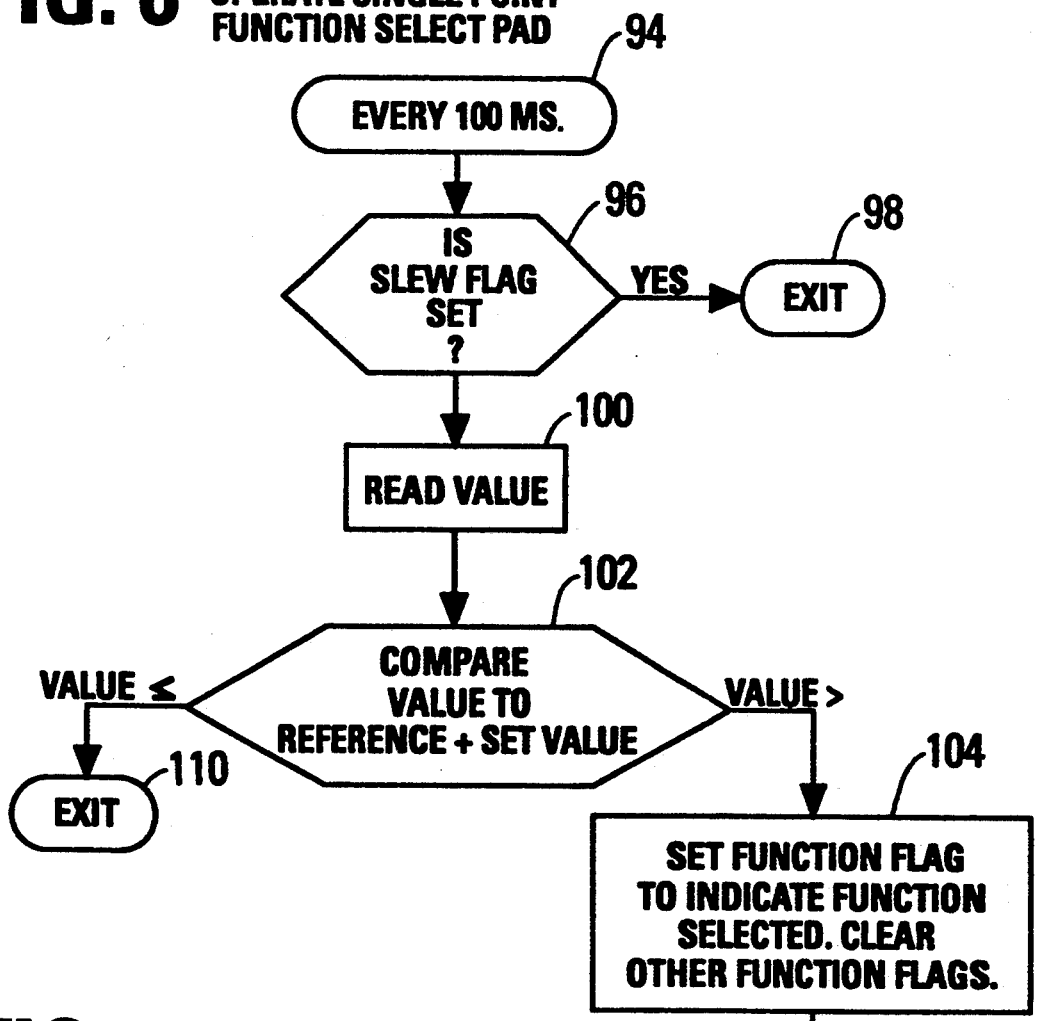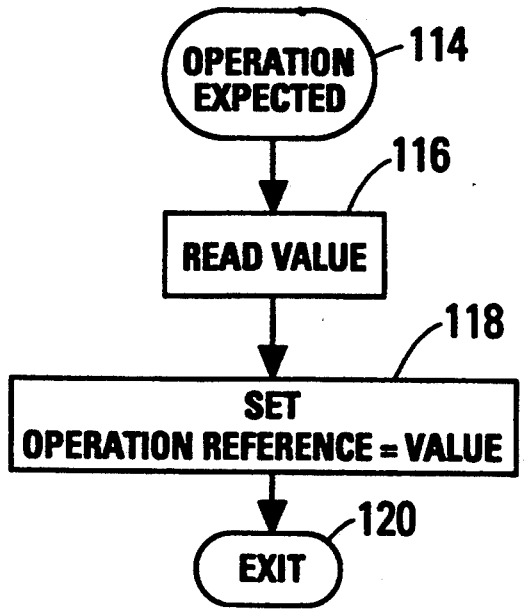

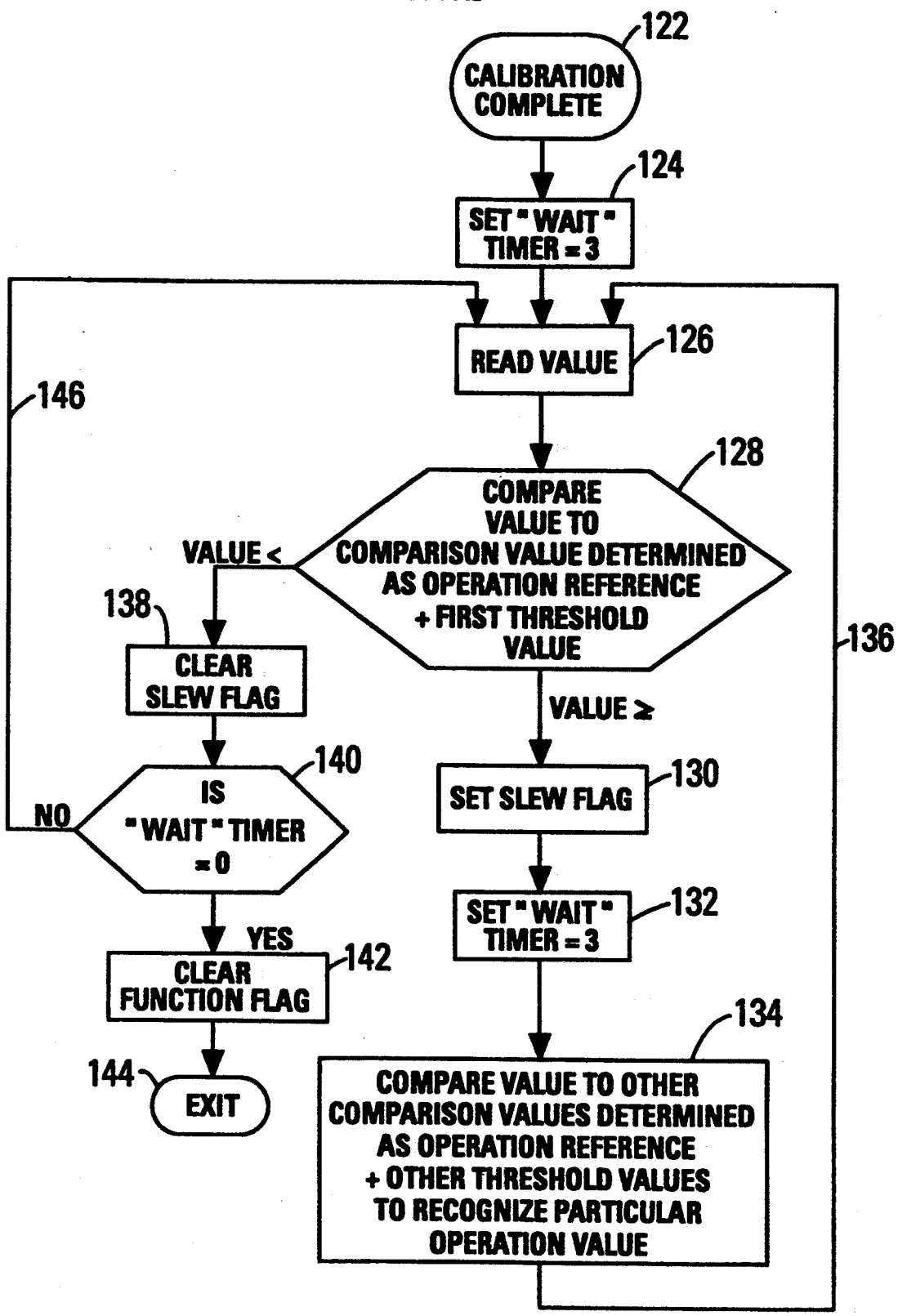

SELF-CALIBRATING VARIABLE PRESSURE TOUCH KEY SYSTEM EMPLOYING TRANSDUCERS SUBJECT TO PARAMETER DRIFT

This application is a continuation, of application Ser. No. 07/769370, filed 10/01/91, now abandoned.

BACKGROUND OF THE INVENTION

The present invention relates generally to pressure-sensitive touch pads for data entry and, more particularly, to a self-calibrating system employing low-cost transducer elements, such as variable-capacitance touch pads, subject to parameter drift.

So-called touch pads are employed for data entry in a wide variety of equipment, such as consumer appliances including microprocessor- or microcontroller-based control systems. Typically, such touch pads include either physical switch contacts often comprising a snap dome for tactile feedback, or an on/off capacitive touch switch wherein the proximity or touch of a finger on a stationary touch pad is sensed by a change in signal level, such as by shunting a signal to ground, whereby the touch is recognized. In the case of such a capacitive touch switch, the change is recognized when the signal level passes a predetermined threshold.

Often such touch pads are used to enter data into an appliance or instrument where the data is represented on a digital display, for example, a digital clock, a digital timer, or a digital indicator of cooking temperature. For setting such digital displays and the underlying function value, up and down slew pads are typically included and arranged such that one pad causes the indicated value to count up, while the other causes the indicated value to count down.

In many cases, it is desirable to provide different or variable slew rates such that the indicated value changes rapidly where the numerical difference between a present and a target reading is great, and changes slowly when the difference between the indicated and the target reading is small. In such cases, two or more slew pads for each direction may be provided, for selecting variable slew rates. A disadvantage of this approach is that additional control panel area is required.

Various forms of variable touch pad data entry systems have been proposed. For example, Bobick U.S. Pat. No. 4,103,252 and Meno U.S. Pat. No. 4,694,279 disclose systems employing position-sensitive capacitive touch switch devices. These systems, however, differ little in concept from systems employing a plurality of discrete pads for providing different slew rates as briefly described above, and share the disadvantage that a larger-than-necessary control panel area is required.

Another approach is represented by Kataoka U.S. Pat. No. 4,673,919, which discloses a multi-point variable pressure sensitive touch key device which provides a plurality of different output pulse frequencies for driving a counter, depending upon the touch pressure. In the Kataoka system, the pressure transducer device comprises a potentiometer.

A disadvantage to such an approach, particularly in a consumer appliance, relates to the accuracy and repeatability of the transducer, particularly where multi-point operation is desired from a single touch pad. In the case of a capacitive touch pad, for example, capacitance will tend to change with changes in temperature, flatness of any overlay, and humidity. In addition, manufacturing and assembly variations can result in each pad having a slightly different capacitance when manufactured, potentially requiring calibration procedures. Nevertheless, capacitive touch pads have desirable characteristics including high reliability resulting from the absence of electrical switch contacts, and ease in providing a flat control panel.

Summarizing the foregoing, attempts to provide touch key systems in general, and multi-point variable-pressure touch key systems in particular, are complicated by parameter variations in the pressure transducers employed, whether resistive or capacitive. Providing a more expensive transducer is not always an acceptable solution, particularly where the advantages of capacitive touch pads are desired. Multi-point variable-pressure touch key systems are advantageous in many situations because they minimize the amount of control panel area required, and can result in simpler user operation.

SUMMARY OF THE INVENTION

Accordingly, it is an object of the invention to provide a low cost variable pressure touch key system, particularly for use in consumer appliances.

It is another object of the invention to provide such a variable pressure touch key system capable of multi-point operation, in contrast to mere on/off operation.

It is another object of the invention to provide a particular construction of a low-cost variable capacitance touch pad for use in such a system.

It is a related object of the invention to provide such a variable pressure touch pad which can exist and operate in a relatively high temperature environment, such as on the control panel of a household cooking range.

Briefly stated, and in accordance with an overall concept of the invention, a pressure transducer device subject to parameter drift is employed in a system, which additionally includes means for periodically, for example once each second, re-calibrating the system. The periodic re-calibration allows the low cost pressure transducer device to be used in a multi-point operation system, as well as in simple on/off operation.

In one form, the pressure transducer device includes a pressure sensitive element, such as a pressure-sensitive variable capacitance element, and transducer conditioning circuitry connected to the pressure sensitive element for producing an output signal. Relatively simple and inexpensive transducer conditioning circuitry can be provided, which circuitry produces a DC output signal that varies in magnitude over an exemplary one volt range depending upon the amount of touch pressure applied.

Means are provided for periodically reading the output signal value to establish a calibration reference value, and means are provided for periodically reading the output signal value and comparing the output signal to a comparison value determined by applying a predetermined change threshold value to the calibration reference value to recognize an operating condition. The recognized operating condition may be either a simple on/off operation, or may be a particular one of a plurality of potential operation values depending upon the amount of touch pressure applied.

In a microprocessor- or microcontroller-based appliance, the means for reading the output signal value and acting thereon typically comprises an analog-to-digital converter connected to the microprocessor which is suitably programmed to perform the control functions. It will be appreciated that very little additional cost is involved since a microprocessor- or microcontroller-based control system is present in any event. Moreover, microprocessors and microcontrollers are available which include analog to digital conversion capability on the chip itself. In any event, this particular application does not require a high performance analog-to-digital converter.

As is described in detail hereinbelow, a variety of specific control strategies may be employed, all having in common periodic and frequent recalibration of a system which employs a low-cost pressure transducer device subject to parameter drift.

In overview, the pads are constantly re-calibrated on a periodic basis to maintain a reference value, and the system acts on changes. If the currently read value differs from the previous value (as represented by the reference) by more than an expected drift range, then deliberate user operation is assumed, and the function is selected.

In one approach for establishing and maintaining a calibration reference, a signal value is read periodically, for example once each second, to establish a calibration reference value.

Calibration and operation may be distinguished by employing a drift range value or threshold for comparison. Thus, the value is compared to the reference plus the drift range. If the value exceeds the reference plus a drift range, then it is assumed that the change in the value is due to an actual operation of the touch switch, and appropriate action is taken. If, on the other hand, the value differs from a previous reading as represented by the reference value by an amount which is within the expected drift range, then it is assumed that no manual operation has occurred. In such a case, the currently-read value may be employed to re-establish the reference.

It will be appreciated that, with this frequent re-calibration, what would otherwise be a relatively low precision system becomes quite accurate, and may be used in a multi-point operation system wherein the values are compared to a plurality of comparison values determined by applying each of a plurality of predetermined change threshold values to the calibration reference value to recognize a particular one of a corresponding plurality of potential operation values, depending upon the amount of pressure applied to the pressure transducer device.

In one embodiment, touch pads in accordance with the invention are employed in pairs, one pad of the pair serving as a simple on/off function select pressure transducer device, and the other pad of the pair serving as a variable operation select pressure transducer device. In such a system, there is provided calibration and operating decision means for periodically calibrating the system to compensate for any drift in characteristics of the transducer elements and for recognizing at least one operating condition. The calibration and operating decision means functions to periodically read the function output signal value to maintain a function select calibration reference value corresponding to a non-activated condition of the function select pressure transducer element, and to recognize a function select operation by periodically re-establishing the function select calibration reference value based on the function output signal value, and recognizing the function select operation when the function output signal value differs from the function select calibration reference value by an amount which is outside an expected drift range.

The calibration and operating decision means functions immediately prior to an expected operation of the variable operation select pressure element as indicated by a recognized function select operation to establish a variable operation select reference value corresponding to a non-activated condition of the variable operation select pressure element by reading the operation output signal value in establishing the variable operation select reference value as the operation output signal value. The calibration and operating decision means functions thereafter to recognize a particular operation value by periodically reading the operation output signal value and comparing the operation output signal value to at least one of a plurality of comparison values respectively determined by applying each of a plurality of predetermined change threshold values to the variable operation select reference value.

Preferably, the pressure sensitive elements in accordance with the invention each include a pressure sensitive variable capacitance element, and the output signals produced by the transducer conditioning circuits have a value dependent on the capacitance of the corresponding pressure sensitive element. In one embodiment, the pressure sensitive variable capacitance elements each comprise a fixed position capacitor plate, an apertured insulating spacer over the fixed capacitor plate, and a flexible electrically conductive overlay layer over the apertured spacer defining a variable position capacitor plate. As a result, touch pressure applied to the flexible overlay decreases the spacing between the capacitor plates and increases the capacitance therebetween. For stability, the flexible electrically conductive overlay is connected to circuit ground.

BRIEF DESCRIPTION OF THE DRAWINGS

While the novel features of the invention are set forth with particularity in the appended claims, the invention, both as to organization and content, will be better understood and appreciated from the following detailed description, taken in conjunction with the drawings, in which:

FIG. 1 depicts a cooking appliance embodying the variable pressure touch key system of the invention;

FIG. 2 is an electrical schematic circuit diagram of a variable pressure touch key system in accordance with the invention;

FIGS. 5A and 5B are representative program flowcharts depicting operations for calibrating a single point function select pad;

FIG. 6 is a representative program flowchart depicting operations for operating a single point function select pad;

FIG. 7 is a representative program flowchart depicting operations for calibrating a multi-point operation select pad; and FIG. 8 is a representative program flowchart depicting operations for operating a multi-point variable operation select pad.

DETAILED DESCRIPTION

Figure 4:
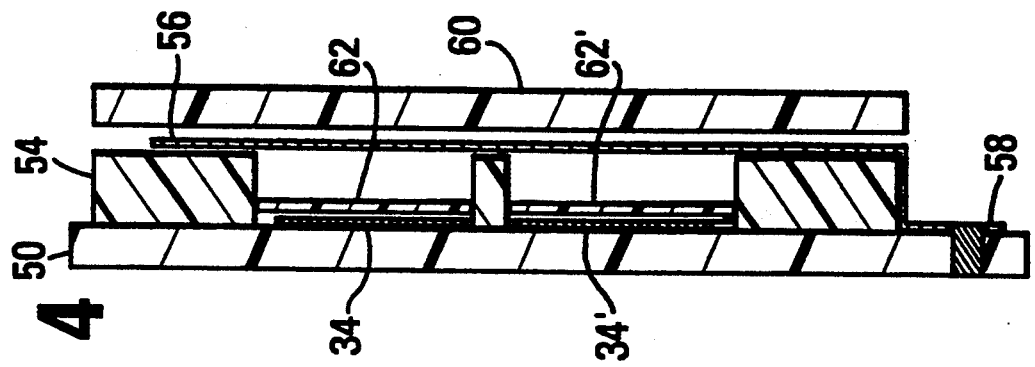
FIG. 4 is a section on line 4—4 of FIG. 3.

Referring first to FIG. 1, a representative appliance 10, in the form of a conventional household range, includes a control panel 12 with an arbitrary arrangement comprising a plurality of representative digital indicators 14, and a plurality of capacitive touch pads 16 in accordance with the invention. It will be appreciated that the particular arrangement on the control panel 12 is representative only, and that a wide variety of control panel arrangements may be employed, depending upon the particular device and its operation.

FIG. 2 is an electrical schematic diagram of a variable pressure touch key system in accordance with the invention, employing an essentially identical pair of capacitive touch pads.

More particularly, the system of FIG. 2 includes a pressure transducer device, generally designated 20, in turn including a pressure sensitive element 22, in the specific form of a pressure sensitive variable capacitance element, and suitable transducer conditioning circuitry, generally designated 24. The transducer conditioning circuitry 24 produces an output signal on a line 26 having a value dependent upon the capacitance of the variable capacitance element 22.

The transducer conditioning circuitry comprises a relatively simple R/C network driven by a representative 100 kHz five volt peak-to-peak AC waveform introduced at a terminal 28 and supplied by a suitable oscillator or clock pulse generator (not shown), preferably associated with other elements of the microprocessor- or microcontroller-based control system. The pressure sensitive capacitor element 22 has an upper plate 30 connected to circuit ground 32, and a lower plate 34 to which the 100 kHz drive signal is supplied through a resistor 36, having an exemplary value 120K ohm, such that the resistor 36 and the capacitor 22 are in series. The AC voltage on the lower capacitor plate 34 is rectified by a diode 38, and filtered by a filter capacitor 40 to produce a DC output voltage on the line 26. A suitable value for the filter capacitor 40 is 0.1 microfarad.

In one embodiment, the upper and lower capacitor plates 30 and 34 are 5/8 inch square, and spaced approximately 0.010 inch apart. When the capacitive element 22 is not touched, the DC output voltage on the line 26 is approximately 1.5 volts. When the upper capacitor plate 30 or a portion thereof is pressed towards the lower plate 34, the capacitance therebetween increases, shunting the AC drive signal to ground, and decreasing the DC output voltage on the line 26. The DC output voltage varies down to approximately 0.5 volts, depending upon the touch pressure.

The output line 26 is connected to the input of an analog to digital convertor 42, the digital output of which is in turn connected to an appropriately-programmed microprocessor or microcontroller 44. The microprocessor 44, among other things, drives a representative digital data entry indicator 46 which indicates the value of an appliance function, such as time of day or cooking time.

Additional touch keys are provided such as the pressure transducer device 20', including pressure sensitive variable capacitance element 22', associated transducer conditioning circuitry 24' and analog to digital converter 42'. Other elements are as described above with reference to the pressure transducer device 20 described hereinabove, with corresponding elements designated by primed reference numerals.

In the particular two-pad system described herein, the pressure-sensitive element 22 may serve as an on/off function select pressure transducer, and the element 22' may serve as a multi-point operation select pressure transducer.

Figure 3:
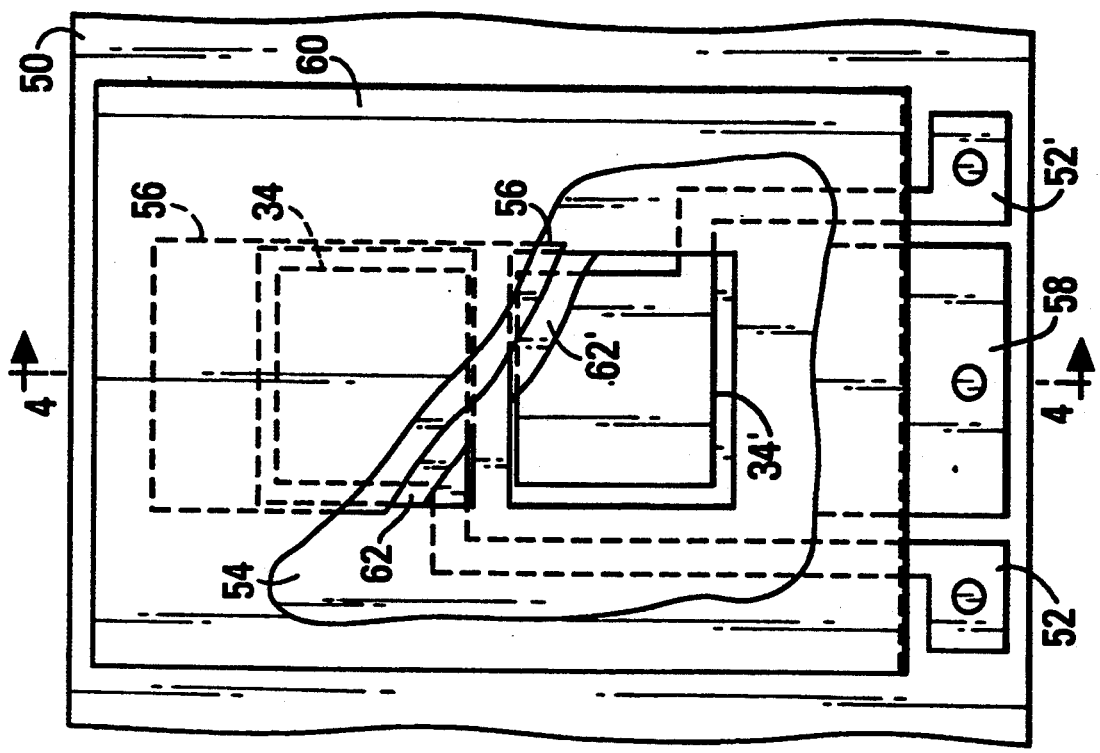
FIG. 3 is a plan view, partially broken away, depicting a pair of variable capacitance touch elements.

Suitable construction details of the pressure-sensitive variable capacitance elements 22 and 22' are illustrated in FIGS. 3 and 4. A printed circuit board 50 supports a pair of fixed position capacitor plates corresponding to the lower capacitor plates 34 and 34' of FIG. 2. A suitable size for the plates 34 and 34' is 5/8 inch square. These two pads 34 and 34' have individual terminals 52 and 52' for connection to the remainder of the circuitry.

Positioned over the fixed capacitor plates 34 and 34' is an apertured insulting spacer 54 of, for example, 0.010 inch in thickness. A flexible, electrically conductive overlay 56 is placed over the apertured spacer 54, defining a variable position capacitor plate with each of the fixed capacitor plates 34 and 34'. The conductive overly 56 is connected to circuit ground at 58 and corresponds to the upper capacitor plates 30 and 30' of FIG. 2.

Preferably, a plastic appearance panel overlay 60 is positioned over the flexible conductive overlay 56, to support graphic indicia and the like.

To prevent shorts between the capacitor plates, thin insulating layers 62 and 62' are placed between the capacitor plates. This prevents electrical contact as the upper plate 56 is deformed by finger pressure.

It will be appreciated that a wide variety of construction techniques may be employed. For example, the flexible overlay 56 may comprise simply a metalized layer on the underside of the flexible plastic appearance panel 60, having suitable durability characteristics to withstand repeated use.

For high temperature operation, the plastic overlay layer 60 may be omitted, and only the flexible electrically conductive overlay 56 provided. For example, the overlay 56 defining the variable position capacitor plates can comprise a thin sheet of stainless steel or conductively coated glass.

Although the transducer elements depicted herein are capacitive transducer elements, it will be appreciated that other forms may be employed. The capacitive elements have particular advantages in that they are relatively easy to fabricate and are not subject to wear.

However, as noted hereinabove, these capacitive elements are subject to capacitance drift. For example, the capacitance of each pad will tend to change with temperature, flatness of the overlay layers 56 and 60, and humidity. In addition, manufacturing tolerances and assembly variations are inevitable.

A particular feature of the invention, particularly in a consumer product, is the use of the programmed microprocessor or microcontroller to in effect continually calibrate each pad on an ongoing basis such that changes or drift in the transducer parameters which do not reflect an actual touch are calibrated out. The flowcharts of FIGS. 5A, 5B, 6, 7 and 8, described hereinbelow, depict representative programming approaches in implementing the invention. It will be appreciated that any suitable programming language may be used to implement the represented programming. It will further be appreciated that a variety of programming approaches may be employed, and the specific flowcharts shown are illustrative only.

FIGS. 5A and 5B in particular together illustrate the operation of calibrating a single-point function select pad, such as the element 22 when employed to select an operation, for example, "Slew Clock Up" or "Slew Clock Down".

The flowchart of FIG. 5A begins an initialize entry at Step 70, entered during system initialization, as part of a microprocessor reset sequence, for example. In Step 72, a variable REFERENCE is set to a maximum value, for example to a numerical value of 99. The initializing procedure exits at 74.

Thereafter, the routine of FIG. 5B is periodically entered at 76, typically once each second, for example as a timer interrupt routine. Conveniently, the FIG. 5B routine is used to maintain a software "WAIT" timer which is decremented once each second if not already zero. (Initial setting of the "WAIT" timer to an exemplary initial value of three and purposes of the "WAIT" timer are described hereinbelow with reference to FIG. 8.) Thus, in decision Step 78 the value of a variable "WAIT" TIMER is compared to zero. If "WAIT" TIMER is already zero, then program execution continues with Step 80. Otherwise, "WAIT" TIMER is decremented in Step 82, and then program execution continues with Step 80.

At Step 80, the output signal value on line 26 is read via the analog-to-digital convertor 42 into a variable VALUE. It will be appreciated that the actual value of the variable VALUE as read and processed by the program is not necessarily the actual DC voltage level on the line 26. Rather, the DC voltage level is scaled, possibly linearized, and converted to a usual range of values for the variable VALUE, by means of a look-up table, for example. As an example, the variable VALUE may have a numerical value within the range of 0 to 99 as the voltage on the line 26 of FIG. 2 ranges from 1.5 volts to 0.5 volts. It will be appreciated the relationship is an inverse one; that is, a decreasing actual voltage on the line 26 indicates increasing touch pressure and is converted to an increasing value for the variable VALUE.

In any event, in decision Step 84, the VALUE as read is compared to the REFERENCE value plus a CALIBRATE THRESHOLD value, established, for example, as a constant having a numerical value of five. If the VALUE just read is less than or equal to the REFERENCE value plus the CALIBRATE THRESHOLD, then in Step 86 the REFERENCE is re-established by being set equal to the VALUE read, and the routine exits at 88. If, on the other hand, the VALUE read is greater than the REFERENCE plus the CALIBRATE THRESHOLD, then in Step 90 the REFERENCE is re-established as the REFERENCE incremented by the CALIBRATE THRESHOLD, and the routine exits at 92.

FIG. 6 depicts program steps for operation of a single point function select pad, such as the element 22 when used in function select operation.

The FIG. 6 routine is periodically entered at 94, for example every 100 milliseconds as an interrupt.

Decision Step 96 asks whether an operation flag variable SLEW FLAG is set (set and cleared by the routine of FIG. 8, described hereinbelow). If SLEW FLAG is set, the FIG. 6 function select pad operation is effectively disabled, and the routine exits immediately at 98. Otherwise, the VALUE is read in Step 100 in the same manner as described hereinabove. In Step 102, the VALUE read is compared to the established REFERENCE plus a predetermined SET VALUE. SET VALUE is a constant having a numerical value greater than a maximum anticipated parameter drift range, for example a constant value of twenty five.

If the VALUE read is greater than the sum REFERENCE+SET VALUE, then in Step 104 a flag variable FUNCTION FLAG is set to indicate the switch represented by the touch pad 22 in effect has been closed at least momentarily to select the particular function. Also, in the usual case of a multi-function control panel, function flags corresponding to other, non-selected functions (not shown) are cleared to ensure that only one function at a time is selected. This affords the user an opportunity to select a different function before proceeding with selecting an operation value; the last function selected controls. The routine exits at 106.

If, on the other hand, the VALUE read is less than the sum REFERENCE+SET VALUE, decision Step simply exits at 110. If a particular operation value is not subsequently selected within the time limit established by the "WAIT" timer, the flag variable FUNCTION FLAG is cleared by the FIG. 8 routine as described hereinbelow.

FIG. 7 shows program flowchart steps for calibrating a multi-point variable operation select pad. The FIG. 7 routine is entered at 114 when an operation of the multi-point variable operation select pad 22' is expected, such as immediately following operation of the function select pad 22 as determined in accordance with the flowchart of FIG. 6. Calibration is relatively straightforward, and comprises simply reading the VALUE in Step 116, and then in Step 118 setting the value of a variable OPERATION REFERENCE equal to the value of the variable VALUE. It will be appreciated that, in the case of the multi-point operation select pad 22', the value of the variable VALUE is based on the voltage on the FIG. 2 line 26' as determined by the A/D converter 42'. The routine then exits at 120.

Finally, the flowchart of FIG. 8 depicts program steps for actually operating the multi-point variable operation select pad, such as the pad 22'. The FIG. 8 routine is entered at Step 122, immediately following the calibration operation of FIG. 7. An initial operation in Step 124 is to initialize the variable "WAIT" TIMER to an initial value of three seconds, for example. It is a standard procedure in controls design to provide a "WAIT" timer such that, once a function is selected, the "WAIT" timer is decremented at a predetermined rate to allow a certain maximum time for continued user data entry after the latest data entry. If user data entry does not continue within the thus-established time limit, data entry is no longer allowed for that particular function selection. Initial values are usually established between three and thirty seconds. Decrementing of the "WAIT" TIMER variable once each second is conveniently accomplished by the FIG. 5B interrupt-driven routine as described hereinabove.

The FIG. 8 routine then continues with Step 126 where the current VALUE is read as described hereinabove. In Step 128, the variable VALUE is compared to a variable COMPARISON VALUE determined as the value of the OPERATION REFERENCE variable established in Step 118 of FIG. 7 plus a predetermined constant FIRST THRESHOLD VALUE.

If the VALUE read is greater than or equal to the variable COMPARISON VALUE, then in Step 130 the flag variable SLEW FLAG is set to indicate that the function select pad reading operation is to be suspended as described hereinabove with reference to FIG. 6. (The FIG. 6 routine continues to be entered every 100 ms.). The flag SLEW FLAG also indicates to other routines (not shown) that at least a minimum operation value has been selected so that slewing of the particular function value can commence. In Step 132, the variable "WAIT" TIMER is reinitialized to three seconds.

The box of Step 134 represents a series of comparisons whereby the VALUE read is compared in sequence to a plurality of other COMPARISON VALUEs each determined as the OPERATION REFERENCE plus respective other predetermined constant THRESHOLD VALUEs. By means of a straightforward software decision tree or other technique, a suitable value for a variable OPERATION VALUE is established. The value of the variable OPERATION VALUE thus represents a particular pressure or discrete step of the multi-point operation select pad 22'. The number of steps from a single multi-point variable capacitance touch pad typically may range from three to nine, for example, depending upon the particular use.

The FIG. 8 routine continuously loops back as indicated by the line 136, to continuously reflect changes in pressure on the variable capacitive element 22'.

At some point, the user's finger pressure is released (or has not yet commenced following operation of the function select pad as determined by the FIG. 6 routine) and, in decision Step 128, the VALUE read is accordingly less than the OPERATION REFERENCE plus the FIRST THRESHOLD value. At this point, in Step 138 the flag variable SLEW FLAG is cleared (or remains clear if not yet set by Step 130 as will be the case after the user has selected a function but has not yet selected an operation value) so that slewing of the particular function value immediately terminates. (Also, the FIG. 6 routine will allow another function to be selected, if desired by the user.) The user however still has an opportunity to re-select an operation value without having to re-select the function. Thus, in decision Step 140 the value of the variable "WAIT" TIMER is compared to zero. If "WAIT" TIMER has reached zero (having been decremented by the FIG. 5B interrupt-driven routine), the FIG. 8 routine clears the FUNCTION FLAG in Step 142, and exits at 144. Otherwise the routine loops back as indicated by the line 146 to Step 126 to again read the VALUE to determine whether the user has again actuated the variable capacitive element 22'.

In the particular example of setting a digital clock or time display 46 (FIG. 2), the user first selects the operation by operating element 22, and then presses variable capacitance touch switch element 22' with a greater or lesser pressured depending upon the desired slew rate for the display 46. Thus, when the user desires the display 46 to change rapidly, a greater finger pressure is used, and vice versa.

It will be appreciated that a wide variety of software techniques may be employed to actually to control the count rate. Thus, Step 134 represents a variety of software techniques whereby the rate may be varied, such as by changing the interval between count pulses applied to the display 46, or by changing the magnitude of display change for each interval.

While specific embodiments of the invention have been illustrated and described herein, it is realized that numerous modifications and changes will occur to those skilled in the arts. It is therefore to be understood that the appended claims are intended to cover all such modifications and changes as fall within in the true spirit and scope of the invention.

What is claimed is:

1. A variable pressure touch key system comprising:
   a pressure transducer device for producing an output signal having a value dependent on touch pressure applied to said transducer device;
   means for periodically reading the output signal value to establish a calibration reference value; and
   means for periodically reading the output signal value and comparing the output signal value to a plurality of comparison values respectively determined by applying each of a plurality of predetermined change threshold values to the calibration reference value to recognize a particular one of a plurality of potential operation values depending on the amount of touch pressure applied to said pressure transducer device.

2. A variable pressure touch key system in accordance with claim 1, wherein the potential operation values comprise different slew rates for setting a data entry indicator.

3. A variable pressure touch key system in accordance with claim 2, wherein said data entry indicator indicates the value of an appliance function.

4. A variable pressure touch key system in accordance with claim 1, wherein said pressure transducer device comprises:
   a pressure sensitive element; and
   transducer conditioning circuitry connected to said pressure sensitive element for producing the output signal.

5. A variable pressure touch key system in accordance with claim 4, wherein
   said pressure sensitive element comprises a pressure sensitive variable capacitance element, and wherein
   the output signal produced by said transducer conditioning circuitry has a value dependent on the capacitance of said element.

6. A variable pressure touch key system in accordance with claim 5, wherein said pressure sensitive variable capacitance element comprises:
   a fixed position capacitor plate;
   an apertured insulating spacer over said fixed capacitor plate; and
   a flexible electrically conductive overlay over said apertured spacer defining a variable position capacitor plate;
   whereby touch pressure applied to said flexible overlay decreases the spacing between said capacitor plates and increases the capacitance therebetween.

7. A variable pressure touch key system in accordance with claim 6, wherein said flexible electrically conductive overlay is connected to a circuit ground.

8. A variable pressure touch key system comprising:
   a pressure transducer device for producing an output signal having a value dependent on touch pressure applied to said transducer device;
   means for periodically reading the output signal value to establish a calibration reference value; and
   means for periodically reading the output signal value and comparing the output signal to a comparison value determined by applying a predetermined change threshold value to the calibration reference value to recognize an operating condition;
   said means for periodically reading the output signal value to establish a calibration reference value reading the output signal value immediately prior to an expected operation of said pressure transducer device when triggered by a recognized function select operation.

9. A variable pressure touch key system in accordance with claim 8, wherein said means for periodically reading the output signal value and comparing to recognize an operating condition repeatedly reads and compares the output signal value to the comparison value to recognize changes in the operating condition.

10. A variable pressure touch key system comprising:

a pressure transducer device for producing an output signal having a value dependent on touch pressure applied to said transducer device; and means for periodically reading the output signal value to maintain a calibration reference value corresponding to a non-activated condition and to recognize at least one operating condition;

said means functioning to re-establish the calibration reference value based on the output signal value when the output signal value differs from the calibration reference value by an amount which is within an expected drift range between calibration intervals, said means functioning to recognize the operating condition when the output signal value differs from the calibration reference value by an amount which is outside the expected drift range, and said means further functioning, when the at least one operating condition is recognized, to compare the output signal value to a plurality of comparison values respectively determined by applying each of a plurality of predetermined change threshold values to the calibration reference value to recognize a particular one of a plurality of potential operation values depending on the amount of pressure applied to said pressure transducer device.

11. A variable pressure touch key system in accordance with claim 10, wherein the potential operation values comprise different slew rates for setting a data entry indicator.

12. A variable pressure touch key system in accordance with claim 11, wherein said data entry indicator indicates the value of an appliance function.

13. A variable pressure touch key system in accordance with claim 10, wherein said pressure transducer device comprises:

a pressure sensitive element; and transducer conditioning circuiting connected to said pressure sensitive element for producing the output signal.

14. A variable pressure touch key system in accordance with claim 13, wherein said pressure sensitive element comprises a pressure sensitive variable capacitance element, and wherein the output signal produced by said transducer conditioning circuiting has a value dependent on the capacitance of said element.

15. A variable pressure touch key system in accordance with claim 14, wherein said pressure sensitive variable capacitance element comprises:

a fixed position capacitor plate;

an apertured insulating spacer over said fixed capacitor plate; and a flexible electrically conductive overlay over said apertured spacer defining a variable position capacitor plate;

whereby touch pressure applied to said flexible overlay decreases the spacing between said capacitor plates and increases the capacitance therebetween.

16. A variable pressure touch key system in accordance with claim 15, wherein said flexible electrically conductive overlay is connected to a circuit ground.

17. A variable pressure touch key system comprising:

a function select pressure transducer device for producing a function output signal having a value dependent on touch pressure applied to said function select pressure transducer device;

a variable operation select pressure transducer device for converting touch pressure to an operation output signal having a value dependent on touch pressure applied to said operation select pressure transducer device; and calibration and operating decision means for periodically calibrating said system to compensate for any drift in characteristics of said function select pressure transducer and said variable operation select pressure transducer devices and for recognizing at least one operating condition, said calibration and operating decision means functioning to periodically read the function output signal value to maintain a function select calibration reference value corresponding to a non-activated condition of said function select pressure transducer device, and to recognize a function select operation by periodically re-establishing the function select calibration reference value based on the function output signal value, and by recognizing the function select operation when the function output signal value differs from the function select calibration reference value by an amount which is outside an the expected drift range, and said calibration and operating decision means functioning immediately prior to an expected operation of said variable operation select pressure device as indicated by a recognized function select operation to establish a variable operation select reference value corresponding to a non-activated condition of said variable operation select reference value as the operation output signal value, and said calibration and operating decision means functioning thereafter to recognize a particular operation value by periodically reading the operation output signal value and comparing the operation output signal value to at least one of a plurality of comparison values respectively determined by applying each of a plurality of predetermined change threshold values to the variable operation select reference value.

18. A variable pressure touch key system in accordance with claim 17, wherein said function select pressure transducer device comprises a function select pressure sensitive element, and a function select transducer conditioning circuit connected to said function select pressure transducer element for producing the function output signal; and wherein said variable operation select pressure transducer device comprises a variable operation select pressure sensitive element, and a variable operation select transducer conditioning circuit connected to said function select pressure transducer element for producing the operation output signal.

19. A variable pressure touch key system in accordance with claim 18, wherein each of said pressure sensitive elements comprises a pressure sensitive variable capacitance element, and wherein the respective output signals produced by said transducer conditioning circuits each have a value dependent on the capacitance of a respective one of said elements.

20. A variable pressure touch key system in accordance with claim 19, wherein each of said pressure sensitive variable capacitance elements comprises:

a fixed position capacitor plate;

an apertured insulating spacer over said fixed capacitor plate; and a flexible electrically conductive overlay over said apertured spacer defining a variable position capacitor plate;

whereby touch pressure applied to said flexible overlay decreases the spacing between said capacitor plates and increases the capacitance therebetween.

21. A variable pressure touch key system in accordance with claim 20, wherein said flexible electrically conductive overlays are connected to a circuit ground.

22. A variable pressure touch key system in accordance with claim 17, wherein the potential operation values comprise different slew rates for setting a data entry indicator.

23. A variable pressure touch key system in accordance with claim 22, wherein said data entity indicator indicates the value of an appliance function.

* * * * *